United States Patent [19]

Alavi et al.

[11] Patent Number: 4,599,728
[45] Date of Patent: Jul. 8, 1986

[54] MULTI-QUANTUM WELL LASER EMITTING AT 1.5 μM

[75] Inventors: Kambiz Alavi, North Plainfield; Alfred Y. Cho; Thomas P. Pearsall, both of Summit; Henryk Temkin, New Providence, all of N.J.

[73] Assignee: AT&T Bell Laboratories, Murray Hill, N.J.

[21] Appl. No.: 512,232

[22] Filed: Jul. 11, 1983

[51] Int. Cl.$^4$ ............................................. H01S 3/19
[52] U.S. Cl. ................................. 372/45; 357/16; 357/17; 357/61
[58] Field of Search ................. 372/44, 45; 357/16, 357/17, 61

[56] References Cited

U.S. PATENT DOCUMENTS 3,982,207  9/1976  Dingle et al. .................... 372/45
4,503,540  3/1985  Nakashima et al. .............. 372/47

OTHER PUBLICATIONS

L. I. Schiff, *Quantum Mechanics*, Third Edition, 1968, pp. 37–44.

Primary Examiner—James W. Davie
Attorney, Agent, or Firm—Richard D. Laumann

[57] ABSTRACT

A multi-quantum well laser having a $Ga_{0.47}In_{0.53}As/Al_{0.48}In_{0.52}As$ active region emitting at 1.55 μm and well layers having a thickness less than 150 Angstroms.

12 Claims, 4 Drawing Figures

MULTI-QUANTUM WELL LASER EMITTING AT 1.5 μM

TECHNICAL FIELD

This invention relates generally to semiconductor lasers and particularly to multi-quantum well semiconductor lasers emitting radiation at a wavelength of approximately 1.5 μm.

BACKGROUND OF THE INVENTION

Optical communications systems as presently contemplated will have a light source and a photodetector optically coupled to each other by means of a glass transmission line which is commonly referred to as an optical fiber. The light source is typically a semiconductor device such as a light emitting diode or a laser. Optical fibers presently used in such communications systems are based on silica compositions which have a region of lowest loss due to absorption and scattering at approximately 1.5 μm and a region of essentially zero dispersion at approximately 1.3 μm. The latter region is of interest because it minimizes the problems associated with pulse broadening due to, for example, material dispersion. Both wavelength regions are desirable for optical communications systems use because they permit, for example, a greater spacing between repeaters or higher information transmission rates. Repeaters are components of the system which detect and regenerate the optical signals. Accordingly, lasers capable of operating in either or both of these wavelength regions are of great interest for optical communications systems.

The present semiconductor laser structure of choice for optical communications systems is a single or double heterostructure laser. Several materials systems, such as Group III–V or Group II–VI compound semiconductors, can be used within these two spectral regions mentioned above to fabricate such lasers. One materials system of great interest for lasers is the quaternary Group III–V alloy $In_xGa_{1-x}As_yP_{1-y}$ which is epitaxially grown lattice matched to InP substrates. However, use of this alloy has several drawbacks. For example, control of the P to As atomic fraction ratio is often difficult when the quaternary alloy is grown by molecular beam epitaxy or vapor phase epitaxy because of the memory effect of the growth system for high vapor pressure Group V elements. Additionally, P is generally a difficult element to deal with and it would be desirable to avoid its presence. Another possible materials system for lasers is the quaternary Group III–V alloy, $Ga_xAl_yIn_{1-x-y}As$, which is also grown lattice matched to InP substrates. If the subscripts x and y are adjusted so as to maintain lattice matching to InP, i.e., $x+y=0.47$, the bandgap of this quaternary alloy can be varied from 1.47 eV to 0.76 eV, thereby permitting the wavelength range from approximately 0.87 μm to approximately 1.65 μm to be covered. This system has the advantage that it avoids the problems that arise when P is used. However, in general, growth of device structures is easier if the semiconductors are binary or ternary rather than quaternary. Additionally, InAlGaAs lasers emitting near 1.5 μm have relatively low luminescence efficiency and high current thresholds. It is hypothesized that these effects are due to a large density of non-radiative centers associated with the presence of Al in the active layer.

In addition to varying the composition to vary the wavelength of emitted radiation, there is another approach to obtaining wavelength tuning within a given materials system. This approach involves the growth of what are now termed "multi-quantum well lasers." Such lasers are described in U.S. Pat. No. 3,982,207 issued on Sept. 21, 1976 to Raymond Dingle and Charles H. Henry. The active region in these lasers is formed by alternating layers of relatively low bandgap material and layers of relatively high bandgap material. In a particular embodiment described, the active low bandgap layers comprised $Al_rGa_{1-r}As$ and the passive high bandgap layers comprised $Al_zGa_{1-z}As$ with $r<z$. Other systems materials, such as AlGaAsP, were mentioned. The bandgaps are described, with respect to each other, as being either "low" or "high." The former layers are termed "well layers" and the latter layers are termed "barrier layers." All layers in the active region are thin to ensure that quantum size effects become important in determining the wavelength of emitted radiation. The carriers are confined to the well layers by the barrier layers and, in the first approximation, the carriers may be viewed as particles in a one-dimensional infinite potential well. As is well known from elementary quantum mechanics, see, for example, *Quantum Mechanics*, L. I. Schiff, pp. 37–44, 1968, the energy levels of particles in such are as given by:

$$E_n = \frac{h^2}{2m^*}\left(\frac{n\pi}{L}\right)^2 \quad (1)$$

where h is Planck's constant divided by $2\pi$, $m^*$ is the effective mass of the carriers, L is the width of the well layer, and n is a positive integer. The emission energy thus increases as the inverse square of the width of the relatively low bandgap material and inversely with the carrier effective mass.

Fabrication of multi-quantum well lasers is more difficult than is the fabrication of, for example, double heterostructure lasers for at least several reasons. First, the presence of a plurality of well and barrier layers means that there will be more interfaces than there are in more conventional laser structures. These interfaces need to be of high quality if the structure is to operate efficiently as a laser. Second, all of the epitaxial layers should be lattice matched to each other. Satisfaction of this condition with, for example, AlGaAs, is relatively easy because the lattice constant is relatively constant over a wide range of compositions. However, for other materials systems in which the lattice constant varies significantly with composition, the compositions of the well and barrier layers have to be carefully controlled if they are to be lattice matched.

However, multi-quantum well lasers emitting precisely selected wavelengths near at approximately 1.5 μm have not been demonstrated and, in fact, cannot be demonstrated with AlGaAs.

SUMMARY OF THE INVENTION

We have found that multi-quantum well lasers comprising first and second wide bandgap confining layers and an active region between said first and second layers, confining said active region comprising a plurality of quantum well layers comprising GaInAs or GaAsSb interleaved with a plurality of barrier layers comprising AlInAs, InP, or AlAsSb is suitable for 1.55 μm laser applications. In a preferred embodiment, the well layers comprise $Ga_{0.47}In_{0.53}As$ and the barrier layers comprise $Al_{0.48}In_{0.52}As$. The confining layers on opposite sides of the active region comprise lattice matched compound semiconductors such as $Al_{0.48}In_{0.52}As$. The relatively large bandgap difference, approximately 0.7 eV, between the well layers and the barrier layers and the large conduction band discontinuity, approximately 0.5 eV, result in efficient carrier confinement. Further, the relatively small electron mass, approximately 0.041 $m_e$, of the $Ga_{0.47}In_{0.53}As$ well layers permits large energy shifts to be obtained in lasers comprising these well layers as compared to nonquantum well structures.

DETAILED DESCRIPTION

Figure 1:
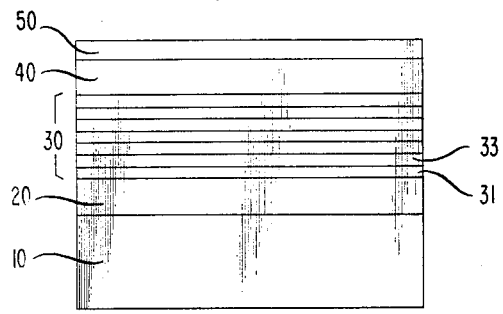
FIG. 1 is a schematic representation of the multi-quantum well laser according to this invention.

A schematic representation of a multi-quantum well laser according to this invention is depicted in a cross-sectional view in FIG. 1. For reasons of clarity, the elements of the laser are not drawn to scale. The device comprises substrate 10, first confining layer 20, active region 30, second confining layer 40, and contact layer 50. In the embodiment depicted, the active region 30 comprises alternating thin narrow bandgap layers 33 of, for example, $Ga_{0.47}In_{0.53}As$, and thin wide bandgap layers 31 of, for example, $Al_{0.48}In_{0.52}As$, i.e., the plurality of narrow bandgap layers is interleaved with the plurality of wide bandgap layers. The first and second confining layers have bandgaps greater than that of the $Ga_{0.47}In_{0.53}As$ layers and provide both carrier and optical confinement. Electron-hole recombination yielding radiation takes place in the narrow bandgap layers due to the carrier confinement. Other compositions are contemplated. For example, the barrier layers may comprise AlInAs, AlAsSb, or InP. The well layers may also comprise GaAsSb.

In the particular embodiment depicted, the substrate comprised S-doped n-type InP and the first confining layer comprised a 2 $\mu m$ thick n-type $Al_{0.48}In_{0.52}As$ layer doped with Sn to a dopant concentration of approximately $10^{18} cm^{-3}$. The active region comprised a plurality of $Ga_{0.47}In_{0.53}As$ layers interleaved with a plurality of $Al_{0.48}In_{0.52}As$ layers. The former layers formed the quantum well layers and the latter layers formed the barrier layers. The active region was doped with Sn to a doping concentration in the low $10^{17} cm^{-3}$ range. An approximately 2 $\mu m$ thick p-type $Al_{0.48}In_{0.52}As$ second confining layer was grown and doped with Be to a concentration of approximately $10^{18} cm^{-3}$. The contact layer comprised a 0.2 $\mu m$ thick $Ga_{0.47}In_{0.53}As$ layer doped with Be to a concentration of approximately $10^{19} cm^{-3}$. All the epitaxial layers are approximately lattice matched to each other, i.e., their lattice constants differ by an amount, $\Delta a/a$, less than approximately $3 \times 10^{-3}$. The first and second confining layers have opposite conductivity type when the laser is electrically pumped but may have the same conductivity type when the laser is optically pumped.

The devices of this invention are expediently grown by using the molecular beam epitaxy techniques that are well known to those skilled in the art. This growth technique is well suited for growing the thin epitaxial layers of the active region and for producing the abrupt interfaces between the layers. However, the compositions of the well and barrier layers must be carefully controlled to obtain accurate lattice matching as the lattice constants of the well and barrier layer compositions vary rapidly with composition. After growth of the epitaxial layers has been completed, conventional laser processing techniques, for example, cleaving and metallizing, are used to complete the fabrication of the laser structures.

Both the number of the layers in the active region, that is, the number of wells and the number of barriers, can be varied as well as their thicknesses. It is desirable that the active region have a total thickness of at least 0.1 $\mu m$ in order to produce a spatially well-directed beam of well-defined wavelength. The barrier layers should be thin enough to permit the carriers to distribute themselves among the well layers by, for example, tunneling through or hopping over, the energy barriers formed by the barrier layers. The quantum well layers have a thickness within a range selected so that the electron quantum energy levels result in radiation in the desired range. Such variation in quantum well thickness, as described below, permits the lasing energy to be varied and wavelength tunability to be obtained.

Exemplary values for the active region parameters are shown in the accompanying Table for laser action obtained by optical pumping. The thicknesses are for each of the individual layers within the active region.

TABLE

| Laser | Active Region | Lasing Energy (eV) | $\Delta E^+$ (meV) |
|---|---|---|---|
| A | 11 wells, 120Å | 0.7804* | |
| | 10 barriers, 120Å | 0.7658 | 40 |
| B | 11 wells, 120Å | 0.7829* | |
| | 10 barriers, 60Å | 0.7718 | 46 |
| C | 8 wells, 120Å | 0.7772* | |
| | 7 barriers, 60Å | 0.7646 | 39.2 |
| D | 13 wells, 90Å | 0.8168 | 91.4 |
| | 12 barriers, 30Å | | |

The lines indicated by * were present only at low pump intensity. Optically pumped conventional double heterostructure lasers having a ternary $Ga_{0.47}In_{0.53}As$ active layer which is lattice matched to InP emit at 1.709 $\mu m$ and the energy shift $\Delta E^+$ is measured from this energy.

The multi-quantum well lasers according to our invention show an upward energy shift which is roughly proportional to the inverse square of the width of the quantum well layer. The scaling of the emission wavelength with well width is indicative of the multi-quantum well structure and not, for instance, the formation of a $Ga_xAl_yIn_{1-x-y}As$ alloy which might be formed by well and barrier layer interdiffusion. It was also found that changes in the barrier thickness, for example, a change from 120 Angstroms to 60 Angstroms, did not affect the emission energy, i.e., the wavelength of the emitted radiation, as is apparent from the Table.

Figure 2:
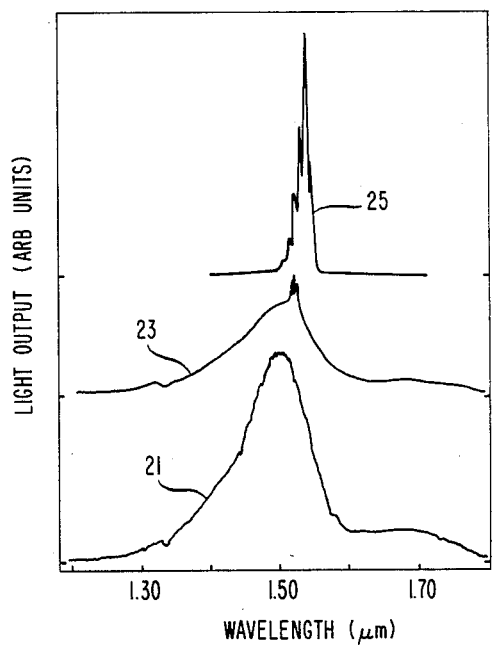
FIG. 2 plots the light output vertically in arbitrary units versus the wavelength of the emitted radiation horizontally in $\mu m$ for multi-quantum well lasers of this invention and for conventional double heterostructure lasers.

FIG. 2 shows the detailed spectra of multi-quantum well lasers under optical pumping. The wavelength is plotted horizontally in units of $\mu m$ and the intensity is plotted vertically in arbitrary units. A Q-switched Nd:YAG laser with a pulse length of approximately 250 nsec and a duty factor of 1–5 kHz was used. The beam was attenuated by a variable density filter and focussed on the laser to a spot which was longer than the mirror to mirror distance of the laser. The luminescence generated was imaged by a vidicon. The spectral measurements were made by focussing the luminescence on the entrance slit of a spectrometer. Spectrum 21 shows the spontaneous emission of a laser having 80 to 90 Angstrom thick well layers and 30 Angstrom thick barrier layers at a pump power half of the threshold value. Only a weak band is observed at 1.66 $\mu$m, which is the wavelength corresponding to the bandgap emission of $Ga_{0.47}In_{0.53}As$ in the contact layer and the main luminescence band is shifted up, to 1.50 $\mu$m. This band is quite strong and its full width at half maximum is typical of ternary layers. The narrow linewidth indicates the absence of any significant interface disorder. The spectrum at threshold, indicated as spectrum 23, shows a lasing transition at 1.518 $\mu$m, which is a shift of approximately 9.8 meV from the luminescence peak. This shift is significantly smaller than the 31 meV characteristics of, for example, $Ga_{0.47}In_{0.53}As$. It should be noted that the individual longitudinal modes are readily resolvable. It should also be noted that no lasing transitions associated with the ternary compound emission are observed. As the pump power was increased to three times threshold, spectrum 25, the multi-quantum well laser emission intensity increased and the peak position shifted to 1.538 $\mu$m. The shift observed as a function of pump intensity was attributed to a sample heating of approximately 30 degrees C. Even at this pump intensity, the individual Fabry-Perot modes could be resolved. This is indicative of the small number of participating longitudinal modes as is expected from the sharpening of the gain profile in multi-quantum well structures.

The data presented in FIG. 2 can be understood in terms of a simple model of a particle in a finite depth potential well. For wells having widths of 80 Angstroms and 90 Angstroms, the upward shifts in the ground state energy of the conduction electron are 67 meV and 58 meV, respectively, as calculated using the treatment described in Schiff. This assumes the $m_e$ is approximately 0.041 $m_o$ for $Ga_{0.47}In_{0.53}As$ and $\Delta E_c = 0.5$ eV for the potential well depth. If the heavy hole contribution, which is approximately 10 percent of the above, is added, energy shifts of 73 meV and 63 meV are expected. The photoluminescence peak shown on spectrum 21 of FIG. 2 occurs at 0.8266 eV and represents a shift of approximately 77 meV from the 0.75 eV emission peak of $Ga_{0.47}In_{0.53}As$. This is in excellent agreement with that calculated for a well thickness between 80 and 90 Angstroms.

Figure 3:
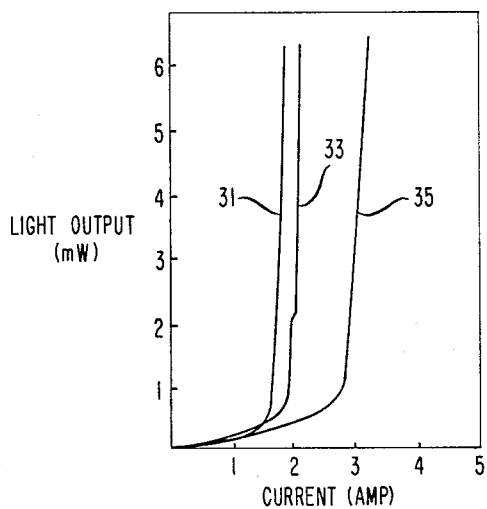
FIG. 3 plots the light output vertically in mW versus current horizontally in units of Amps for a multi-quantum well laser of this invention.

The light output is plotted vertically in units of mW versus the injection current horizontally in units of Amps for broad area injection lasers according to this invention in FIG. 3. The curves 31, 33 and 35 represent temperatures of 20, 40 and 60 degrees C., respectively. The injection laser threshold varies from a high of 7 kA/cm$^2$ down to a value of 2.4 kA/cm$^2$, which is the lowest value obtained to date. As is evident, the light output versus current curves that are shown in FIG. 3 are relatively smooth and largely free of kinks. The lack of kinks indicates the absence of filamentary lasing within the broad area device.

Figure 4:
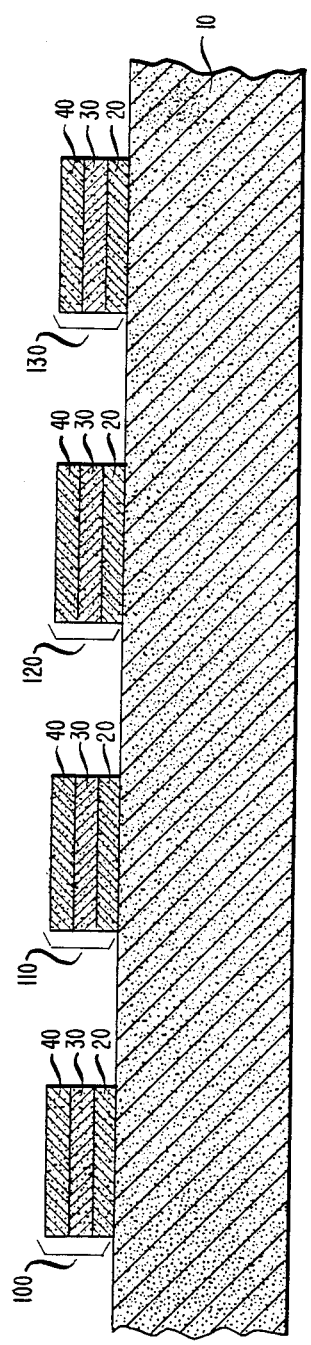
FIG. 4 depicts an array of lasers according to this invention.

Modifications will be readily thought of by those skilled in the art. For example, arrays of lasers may be fabricated on a common substrate with the individual lasers having either the same or different well widths. FIG. 4 depicts an array of lasers according to this invention. Depicted are lasers 100, 110, 120 and 130 on substrate 10. Each laser comprises an active region 30 and first and second wide bandgap confining layers 20 and 40, respectively. The latter type of array is of interest because it permits fabrication of a monolithic laser array with each laser having a different lasing frequency within a determined emission range. Such an array is useful for wavelength division multiplexing.

The growth technique previously described may be modified to permit fabrication of arrays with each laser having a different emission wavelength. For example, the shutters in front of the ovens may be opened and closed to the same side of the wafer at a speed comparable to the desired growth rate. For example, if the growth rate is 10 Angstroms/sec, a shutter opening that takes 10 sec results in a 100 Angstrom variation in thickness for each layer across the wafers. If desired, the shutter may be moved in discrete steps.

Additionally, a mask may be used which has, for example, slits of varying width. Assume that the spacing of the mask from the substrate and the widths of the slits are such that the substrate does not see the entire source; i.e., the mask reduces the flux incident on the substrate. Then, for a mask spaced a distance, h, from the substrate and for two slits of width, $d_1$ and $d_2$, tan $\theta_1 = d_1/2h$ and tan $\theta_2 = d_2/2h$, where $\theta_1$ and $\theta_2$ are the half angles of the slits as seen from a point on the substrate directly under the slit. For the slit to be effective tan $\theta_1$ and tan $\theta_2$ must be less than tan $\theta_0$ where $\theta_0$ is the half angle of the oven as seen from a point on the substrate, i.e., tan $\theta_0 = s/2h'$ where s is the oven opening and h' is the substrate to oven spacing. Thus, when tan $\theta_1$ and tan $\theta_2$ are both less than tan $\theta_0$, it can be seen that the relative arrival rate of material and, hence, the growth rate, through slit 1 to that through slit 2 is (tan $\theta_1$/tan $\theta_2$) which equals ($d_1/d_2$) when the slits are equidistant from the substrate.

Example: For an oven opening of 2.5 cm and a distance between oven and substrate of 12.5 cm, tan $\theta_0 = 0.1$. Thus, tan $\theta_1 < 0.1$ and tan $\theta_2 < 0.1$ which means that h $\geq 5d_1$ and $5d_2$.

It should be understood that the mask may have more than two slits.

What is claimed is:

1. In a semiconductor heterostructure laser structure comprising first and second wide bandgap confining layers; and
   an active region between said first and second wide bandgap confining layers, said active region comprising a plurality of well layers comprising at least one semiconductor selected from the group consisting of GaInAs and GaAsSb interleaved with a plurality of barrier layers, said well layers having a thickness less than 150 Angstroms.

2. A laser as recited in claim 1 in which said barrier layers comprise at least one semiconductor selected from the group consisting of AlInAs, InP and AlAsSb.

3. A laser as recited in claim 2 in which said well layers comprise $Ga_{0.47}In_{0.53}As$.

4. A laser as recited in claim 3 in which said barrier layers comprise $Al_{0.48}In_{0.52}As$.

5. A laser as recited in claim 4 in which said confining layers comprise $Al_{0.48}In_{0.52}As$.

6. A laser as recited in claim 5 in which said confining layers have opposite conductivity types.

7. A plurality of semiconductor lasers as recited in claim 2, said plurality being fabricated on a common substrate.

8. A plurality as recited in claim 7 in which said well layers comprise GaInAs.

9. A plurality as recited in claim 8 in which said well layers of said lasers of said plurality have different thicknesses.

10. A plurality as recited in claim 8 in which said barrier layers comprise AlInAs.

11. A plurality as recited in claim 10 in which said well layers of said lasers of said plurality have different thicknesses.

12. A plurality as recited in claim 7 in which said well layers of said lasers of said plurality have different thicknesses.

* * * * *